United States Patent
Saggio et al.

(10) Patent No.: US 7,838,927 B2
(45) Date of Patent: Nov. 23, 2010

(54) PROCESS FOR MANUFACTURING A MULTI-DRAIN ELECTRONIC POWER DEVICE INTEGRATED IN SEMICONDUCTOR SUBSTRATE AND CORRESPONDING DEVICE

(75) Inventors: Mario Giuseppe Saggio, Acicastello (IT); Ferruccio Frisina, Sant'Agata Li Battiati (IT); Simone Rascuna, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 96 days.

(21) Appl. No.: 11/971,168

(22) Filed: Jan. 8, 2008

(65) Prior Publication Data
US 2009/0001460 A1 Jan. 1, 2009

Related U.S. Application Data

(63) Continuation-in-part of application No. PCT/EP2006/006671, filed on Jul. 7, 2006.

(30) Foreign Application Priority Data
Jul. 8, 2005 (EP) .................................. 05425493

(51) Int. Cl.
H01L 27/108 (2006.01)
(52) U.S. Cl. ................................. 257/330; 257/E21.337
(58) Field of Classification Search .................. 438/138, 438/140; 257/E21.418, E29.04, E29.066, 257/E29.257, 341, 401
See application file for complete search history.

(56) References Cited

U.S. PATENT DOCUMENTS

2003/0148559 A1 8/2003 Onishi et al.
2006/0180857 A1* 8/2006 Loechelt et al. ............. 257/341
2007/0001194 A1* 1/2007 Ono et al. .................. 257/127

OTHER PUBLICATIONS

Saggio, M. et al., "MDmesh: innovative technology for high voltage PowerMOSFETs," Proceedings of the International Symposium on Power Semiconductor Devices and ICS, New York, NY, May 22, 2000, pp. 65-68.

Onishi, Y. et al., "24mOhm.cm2 680V Silicon Superjunction MOSFET," Proceedings of the 14th International Symposium on Power Semiconductor Devices and ICS, Santa Fe, NM, Jun. 4-7, 2002, pp. 241-244.

* cited by examiner

Primary Examiner—Davienne Monbleau
Assistant Examiner—Shweta Mulcare
(74) Attorney, Agent, or Firm—Lisa K. Jorgenson; Robert Iannucci; Seed IP Law Group PLLC

(57) ABSTRACT

A process manufactures a multi-drain power electronic device on a semiconductor substrate of a first conductivity type and includes: forming a first semiconductor layer of the first conductivity type on the substrate, forming a second semiconductor layer of a second conductivity type on the first semiconductor layer, forming, in the second semiconductor layer, a first plurality of implanted regions of the first conductivity type using a first implant dose, forming, above the second semiconductor layer, a superficial semiconductor layer of the first conductivity type, forming in the surface semiconductor layer body regions of the second conductivity type, thermally diffusing the implanted regions to form a plurality of electrically continuous implanted column regions along the second semiconductor layer, the plurality of implanted column regions delimiting a plurality of column regions of the second conductivity type aligned with the body regions.

20 Claims, 7 Drawing Sheets

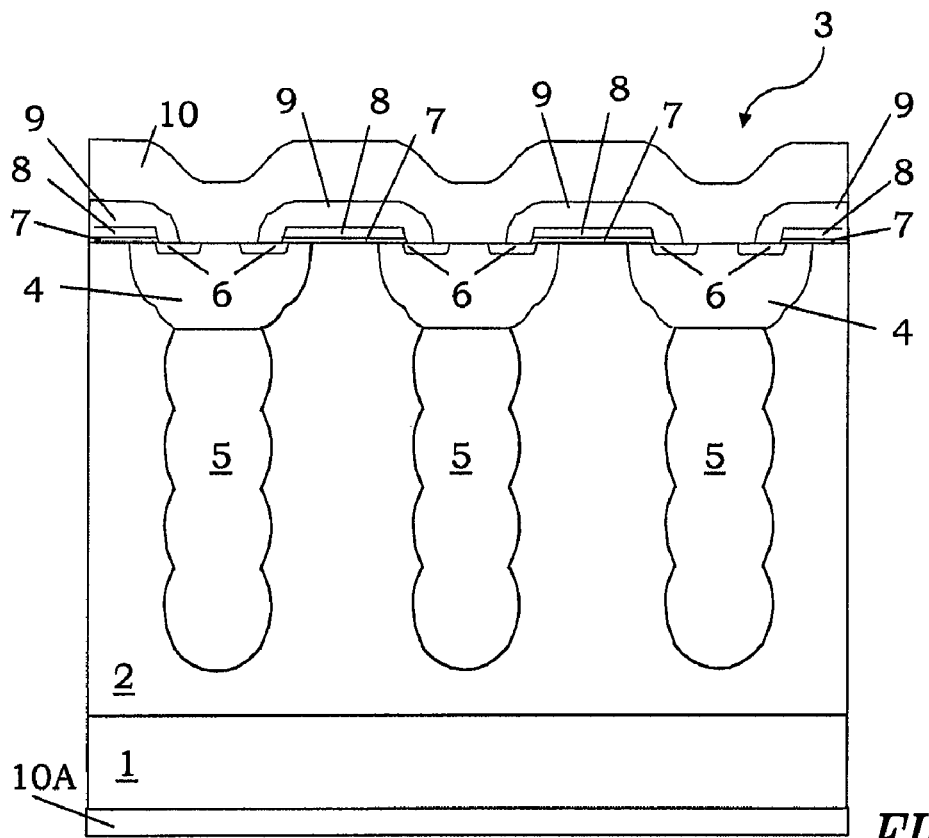
*FIG. 1*
*(Prior Art)*
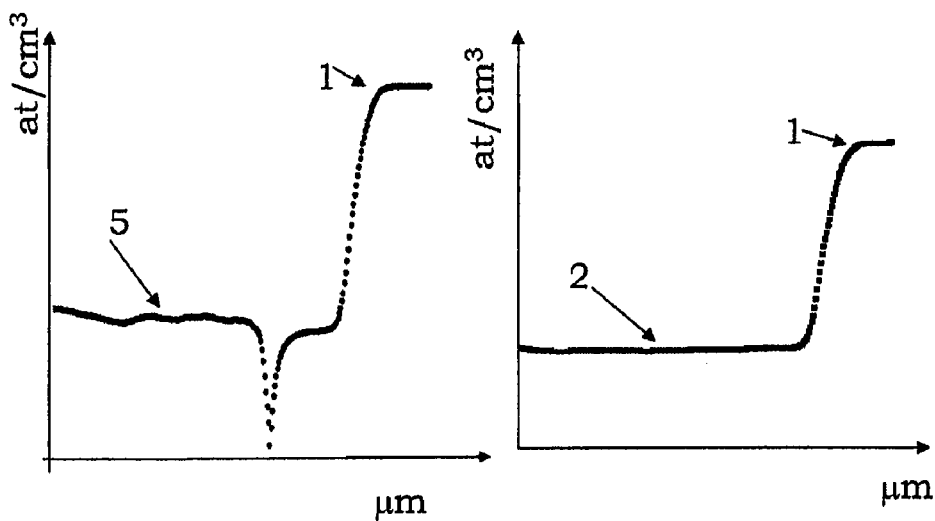
*FIG. 2*
*(Prior Art)*
*FIG. 3*
*(Prior Art)*

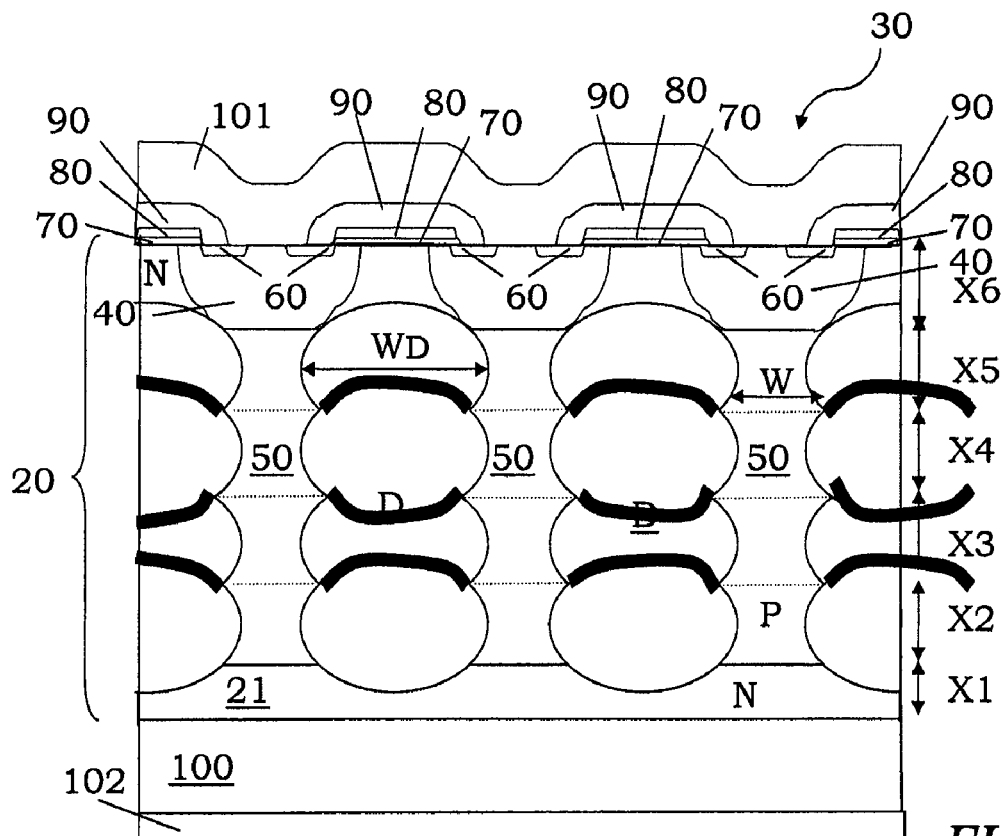
FIG. 16
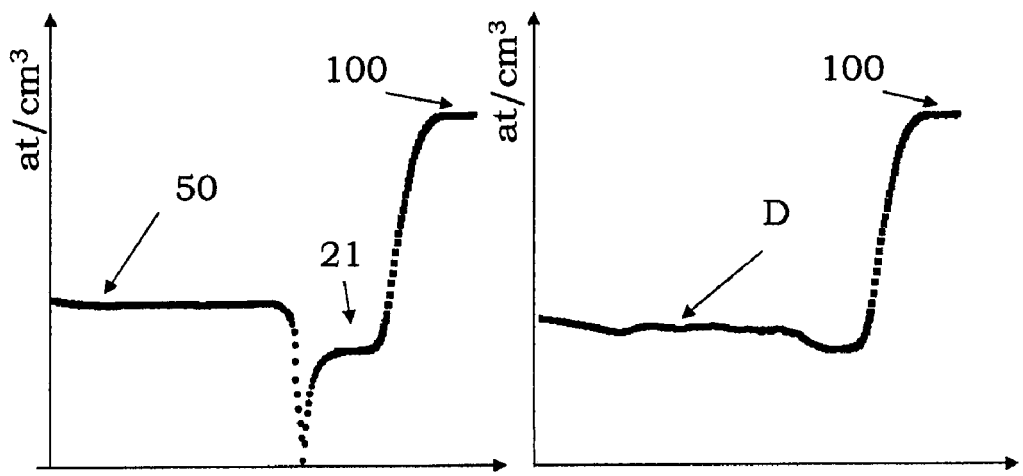
FIG. 17
FIG. 18

… … …

PROCESS FOR MANUFACTURING A MULTI-DRAIN ELECTRONIC POWER DEVICE INTEGRATED IN SEMICONDUCTOR SUBSTRATE AND CORRESPONDING DEVICE

BACKGROUND

1. Technical Field

The present invention relates to a process for manufacturing a multi-drain power electronic device integrated on a semiconductor substrate.

More specifically, the invention relates to a process for manufacturing a multi-drain power electronic device integrated on a semiconductor substrate of a first type of conductivity.

The invention particularly, but not exclusively, relates to a process for manufacturing a multi-drain power MOS transistor and the following description is made with reference to this field of application by way of illustration only.

2. Description of the Related Art

As it is well known, power MOS devices with a breakdown voltage BV comprised between 200 and 1000V have a high output resistance (Ron) mainly due to the resistance of the epitaxial drain layer which is used to withstand high voltages and which depends on the concentration of dopant of the epitaxial layer itself.

However, the possibility is also known of obtaining power MOS devices with a low output resistance and a high breakdown voltage BV by modifying the epitaxial layer concentration.

A known MOS device meeting this need is shown in FIG. 1, globally indicated with 3. Such a power MOS device is of the so called multi-drain type and it comprises a heavily doped semiconductor substrate 1, in particular of the N+ type, whereon a semiconductor epitaxial layer 2 of the same N type is formed.

The epitaxial layer 2 forms a common drain layer for a plurality of elementary units forming the power MOS device 3. Each elementary unit comprises a body region 4, in particular of the P type, formed on the epitaxial layer 2.

In the epitaxial layer 2, below each body region 4, there is a column region 5, in particular of the P type, which extends downwards for substantially the whole thickness of the epitaxial layer 2 towards the semiconductor substrate 1.

In particular, each column region 5 is aligned and in contact with a respective body region 4 of an elementary unit of the power MOS device 3.

In such way, as shown in FIG. 2 wherein the concentration of the epitaxial layer 2 versus its thickness is illustrated, the N epitaxial layer 2 of the power MOS device 3 thus formed has a constant resistivity. Also the column regions 5 have a constant concentration along their whole column extension, as shown in FIG. 3 wherein the concentration of the column regions 5 versus their thickness is illustrated.

The power MOS device 3 also exhibits, inside the body regions 4, heavily doped source regions 6, in particular of the N type.

The surface of the epitaxial layer 2 is thus covered with a thin gate oxide layer 7 and with a polysilicon layer 8. Openings are provided in the polysilicon layer 8 and in the thin gate oxide layer 7 to uncover portions of the epitaxial layer 2 surface aligned with each source region 6. An insulating layer 9 completely covers the polysilicon layer 8 and it partially covers the source regions 6, so as to allow a source metallic layer 10 to contact the source regions 6 and the body regions 4. A drain metallic layer 10A is also provided on the lower surface of the semiconductor substrate.

It is to be noted that the presence of the column regions 5 thus allows to reduce the resistivity of the epitaxial layer 2 without decreasing the breakdown voltage BV of the power MOS device 3 as a whole. With this type of devices it is thus possible to reach a predetermined breakdown voltage BV with a resistivity of the epitaxial layer being lower than that used in conventional MOS devices and, in consequence, to obtain power MOS transistors with reduced output resistance.

Moreover, as shown in FIG. 4, power MOS devices 3 formed by means of a plurality of elementary units provided with column regions 5 exhibit an output resistance, being the breakdown voltage equal, shown by the curve A, lower not only than that of conventional MOS devices, shown by the curve B, but also lower than the so called silicon ideal limit, shown by the curve C.

So as to better understand the dynamics of these known devices, with reference to Figures from 5 to 9, a method is now described by means of which the multi-drain power MOS device of FIG. 1 is formed.

In particular, on the N+ heavily doped semiconductor substrate 1 an epitaxial layer 2 is formed comprising, on the bottom, a first epitaxial layer 2a of the N type with a dopant concentration corresponding to a resistivity $\rho$.

After having formed a first photolithographic mask on the second epitaxial layer 2a, a trench is formed in this second epitaxial layer 2a through the first photolithographic mask for forming a zero level indicator not shown in the Figures.

A second mask is then formed on such first epitaxial layer 2a wherein a plurality of openings are formed.

Through these openings a first implant step of P dopant is carried out for forming first implanted regions 5a, as shown in FIG. 5.

As shown in FIG. 6, on the first epitaxial layer 2a a second N epitaxial layer 2b is formed with a dopant concentration corresponding to the resistivity $\rho$.

A third mask is then formed, aligned with the second mask by means of the zero level indicator, on the second epitaxial layer 2b wherein a plurality of openings are formed.

Through these openings a second implant step of a P dopant is carried out in the second epitaxial layer 2b for forming second implanted regions 5b.

As shown in FIG. 7, on the second epitaxial layer 2b, a third N epitaxial layer 2c is then formed which has a dopant concentration corresponding to the resistivity $\rho$.

A fourth mask is then formed, aligned with the second, third mask by means of the zero level indicator, on the third epitaxial layer 2c wherein a plurality of openings are formed.

Through these openings a third implant step of P dopant is carried out in the third epitaxial layer 2c for forming, by means of a successive diffusion process, third implanted regions 5c.

As shown in FIG. 8, on the third epitaxial layer 2c, the fourth N epitaxial layer 2d is then formed which has a dopant concentration always corresponding to the resistivity $\rho$.

A fifth mask is then formed, aligned with the second, third and fourth by means of the zero level indicator, on the fourth epitaxial layer 2d wherein a plurality of openings are formed.

Through these openings a fourth implant step of P dopant in the fourth epitaxial layer 2a is carried out for forming fourth implanted regions 5d.

Obviously, it is possible to provide any number of masking steps and subsequent dopant implantation for forming a plurality of implanted regions being aligned and arranged in a succession of epitaxial layers overlapped onto each other.

As shown in FIG. 9, as last, on the fourth epitaxial layer 2d, a fifth N epitaxial layer 2e is formed having a fifth dopant concentration always corresponding to the resistivity ρ.

A sixth mask is then formed, aligned with the second, third and fourth and fifth mask by means of the zero level indicator, on the fifth epitaxial layer 2e wherein a plurality of openings are opened.

Through these openings, a fifth implant step of P dopant is then carried out in the fifth epitaxial layer 2e for forming the body regions 4 of the power MOS device 3, as shown in FIG. 1.

A seventh mask is then formed, aligned with the second, third and fourth and fifth and sixth mask by means of the zero level indicator, on the fifth epitaxial layer 2e wherein a plurality of openings are formed.

Through these openings a sixth implant step of N dopant is then carried out in the fifth epitaxial layer 2e for forming the source regions 6 of the power MOS device 3.

A diffusion thermal process is then carried out for diffusing the implanted regions 5a, 5b, 5c, 5d, the body regions 4 and the source regions 6 of the power MOS device 3 and so that the implanted regions 5a, 5b, 5c, 5d form a single column region aligned and in contact with the body region 4.

The process is then completed with the conventional process steps which include the formation of the thin gate oxide layer 7 and the polysilicon layer 8 on the surface of the epitaxial layer 2. Openings are then provided in the polysilicon layer 8 and in the thin gate oxide layer 7 until they uncover portions of the epitaxial layer 2 surface aligned with each source region 6. The insulating layer 9 is formed until it completely covers the polysilicon layer and it partially covers the source region 6, so as to allow a source metallic layer 10 formed on the power MOS device 3 to contact the source regions 6 and the body regions 4. A drain metallic layer 10A is finally formed on the lower surface of the semiconductor substrate 1.

It is to be noted that the presence of the column regions 5 hooked onto the body regions 4 empties the drain region 2, allowing the power MOS device 3 thus formed to withstand a predetermined voltage applied from the outside to the device even in presence of high concentrations of dopant in the epitaxial layer 2 (which is an conductive layer of the N type, in the case of N channel devices like the one shown with reference to FIGS. 1 and 5-9).

Moreover, the breakdown voltage BV that the power MOS device 3 thus obtained can withstand, varies, the resistivity of the epitaxial layer 2 being equal, with the dopant concentration in the column regions 5 (which are, in the example shown in FIGS. 1 and 5-9, of the P type).

In particular, as shown in FIG. 10, the breakdown voltage BV varies when the P dopant concentration in the drain epitaxial layer 2 increases: in particular, the voltage BV is the highest when the N dopant concentration in the drain epitaxial layer 2 is completely balanced by the P dopant concentration introduced by an implant P dose $\Phi_E$ used for forming the column regions. This condition is indicated as "charge balance".

If, during the first P dopant implant step for forming first implanted regions 5a an implant dose $\Phi$ lower than the implant dose $\Phi_E$ is used, the final concentration of the column regions 5 is lower than the concentration of the column regions 5 obtained by means of the implant dose $\Phi_E$ used in the case of "charge balance". This condition is indicated as "p charge fault", or, equivalently, "n charge excess". If, during the first P dopant implant step for forming first implanted regions 5a, an implant dose $\Phi$ higher than the implant dose $\Phi_E$ is used, the concentration of the column regions 5 obtained in the case of "charge balance". This condition is indicated as "p charge excess" or, equivalently, "n charge fault".

As it has been noted, under both the described charge excess/fault conditions, the breakdown voltage BV of the devices obtained is lower than that which is obtained by using the implant dose $\Phi_E$.

Moreover, in these devices of the multi-drain type, the resistivity of the epitaxial layer 2 sets the distance between two adjacent column regions 5 and thus the pitch of the whole power MOS device 3 thus formed. The lateral extension and the shape of the column regions 5 is in fact univocally determined by the temperature used in the diffusion thermal process for the formation of the column regions 5.

Moreover, the breakdown voltage BV the power MOS device 3 must be able to withstand defines the height of the column regions 5: for a device of 500 V it is comprised between 20 and 30 μm.

However, the area occupied by the column regions 5, useful for the cut-off step, is not used during the conduction of the power MOS device 3: the lateral widening from the column regions 5 limits in fact the electrical performances in conduction of the power MOS device 3 thus formed.

A possible solution for reducing the width of the column regions 5 and increasing the density of the elementary units, maintaining the characteristics of withstanding the high voltages of the power MOS device, it is that of containing the thermal balance during the diffusion thermal process thus decreasing the lateral diffusion of the regions 5a, 5b, 5c and 5d implanted in the epitaxial layers. However, in the diffusion thermal process with limited thermal budget to allow however the implanted regions 5a, 5b, 5c and 5d to form a single electrically continuous P column region it is necessary to reduce the thickness of each single epitaxial layer 2a, 2b, 2c and 2d wherein each one of such implanted regions 5a, 5b, 5c and 5d is formed. In reality, by reducing the thickness each single epitaxial layer 2a, 2b, 2c and 2d decreases the thickness of the drain region 2 and thus the final breakdown voltage BV the power MOS device 3 thus obtained can withstand.

By using thermal processes with reduced thermal budget and thus reduced thicknesses for the drain epitaxial layer 2, for obtaining power MOS devices which can withstand a predetermined voltage equal to that which can be obtained with devices formed with greater thermal budgets, the number of the epitaxial layers forming the drain epitaxial layer 2 and relative implant steps which form P column regions 5 is to be increased.

This solution remarkably increases the manufacturing costs of the power MOS devices 3 thus formed.

BRIEF SUMMARY

One embodiment is a process for manufacturing a multi-drain power electronic device integrated on a semiconductor substrate having such structural characteristics as to allow to obtain devices having low output resistances and contained dimensions (and reduced pitch) overcoming the limits still affecting the devices formed according to the prior art.

One embodiment is a multi-drain power electronic device integrated on a semiconductor substrate comprising P column regions obtained epitaxially as well as N regions delimiting them and obtained by means of implantation. So the column regions exhibit a reduced lateral size.

The characteristics and advantages of a process and of a device according to embodiments of the invention will be apparent by the following description of an embodiment thereof given by way of indicative and non limiting example with reference to the annexed drawings.

BRIEF DESCRIPTION OF THE SEVERAL VIEWS OF THE DRAWINGS

In such drawings:

FIG. 1 is a section view of a multi-drain power MOS transistor of the known type;

FIGS. 2 and 3 respectively show a concentration profile of the N drain epitaxial layer and of the P column region for the multi-drain power MOS transistor of FIG. 1;

FIGS. 11 to 16 show vertical section views of a multi-drain power device during some manufacturing steps of the method according to the invention;

FIGS. 17 and 18 respectively show a concentration profile in the N layer and in the P column regions of the multi-drain power device of FIG. 16.

DETAILED DESCRIPTION

With reference to the figures, a method is described for manufacturing a multi-drain power electronic device integrated on a semiconductor substrate.

The hereafter described process steps do not form a complete process flow for the manufacturing of integrated circuits. The present invention can be put into practice together with the integrated circuit manufacturing techniques currently used in the field, and, in the description, only those process steps being commonly used are described which are necessary for the comprehension of the present invention.

The figures showing cross sections of portions of an integrated electronic device during the manufacturing are not drawn to scale, but they are instead drawn so as to illustrate characteristics of various embodiments.

With reference to FIGS. 11 to 16 the method is now described to manufacture a power electronic device, in particular for manufacturing a multi-drain power MOS device, globally and schematically indicated with 30.

Figure 4:
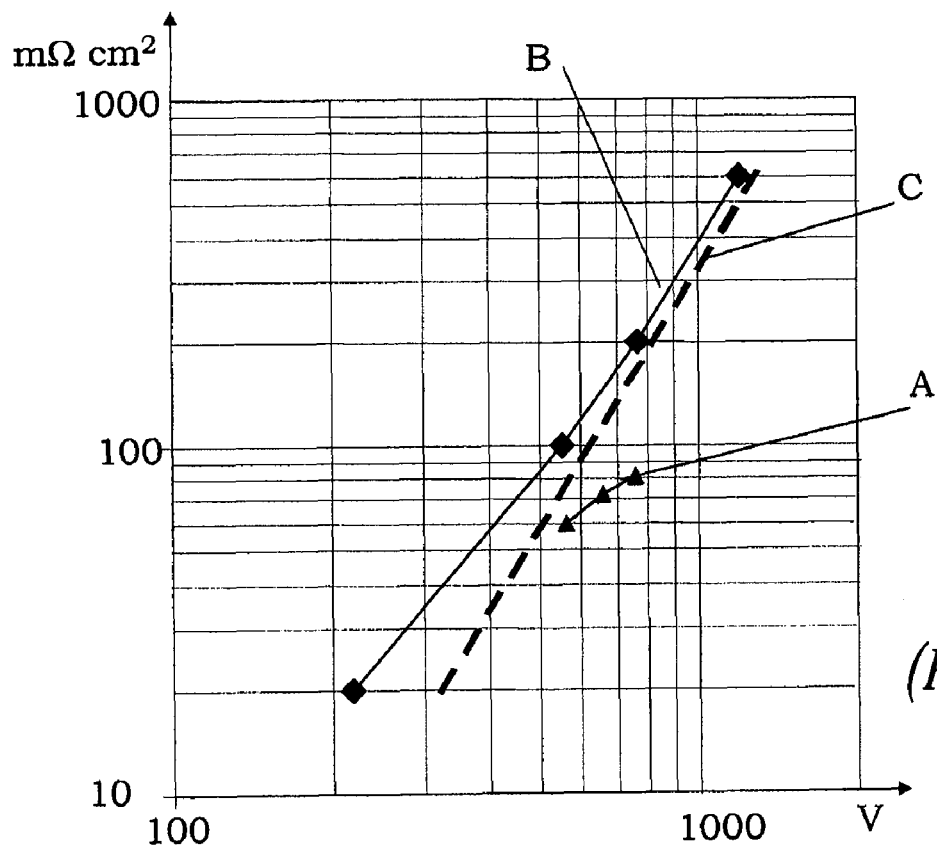
FIG. 4 shows the trend of the output resistance for area when the breakdown voltage BV varies for multi-drain MOS power devices, curve A, for conventional MOS power devices, curve B, and for the ideal limit in the silicon, curve C.
Figure 10:
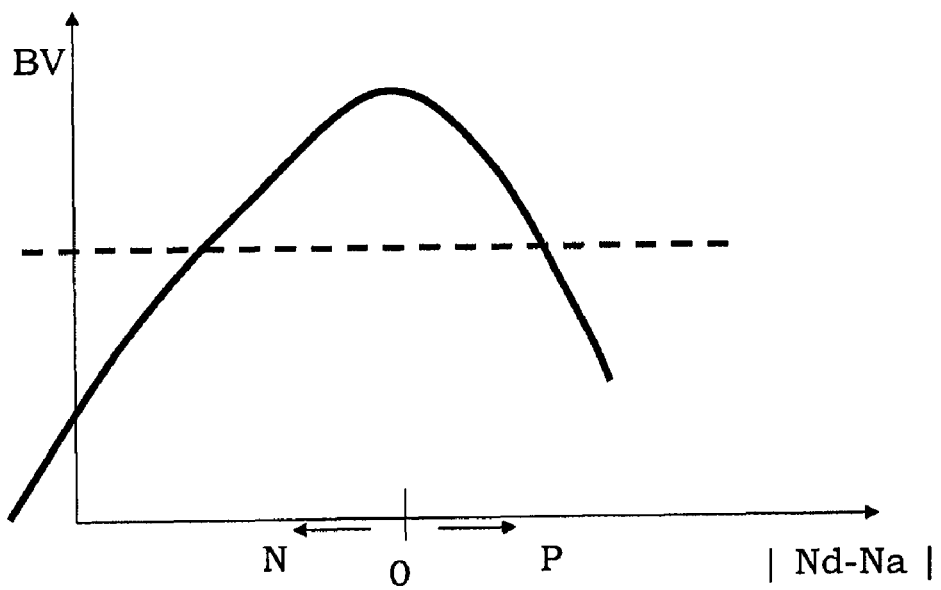
FIG. 10 shows the trend of the breakdown voltage BV when the charge balance conditions vary in the drain in multi-drain power MOS devices of the known type.
Figure 5:
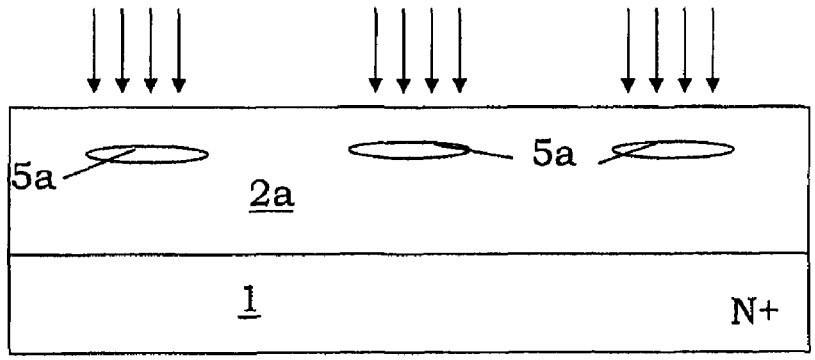
FIGS. 5 to 9 show vertical section views of the multi-drain power device of FIG. 1 during some steps of the manufacturing process.
Figure 6:
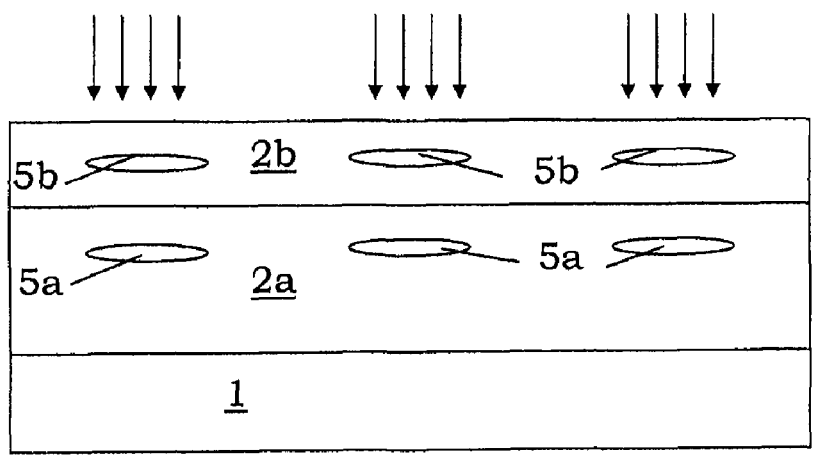
Figure 7:
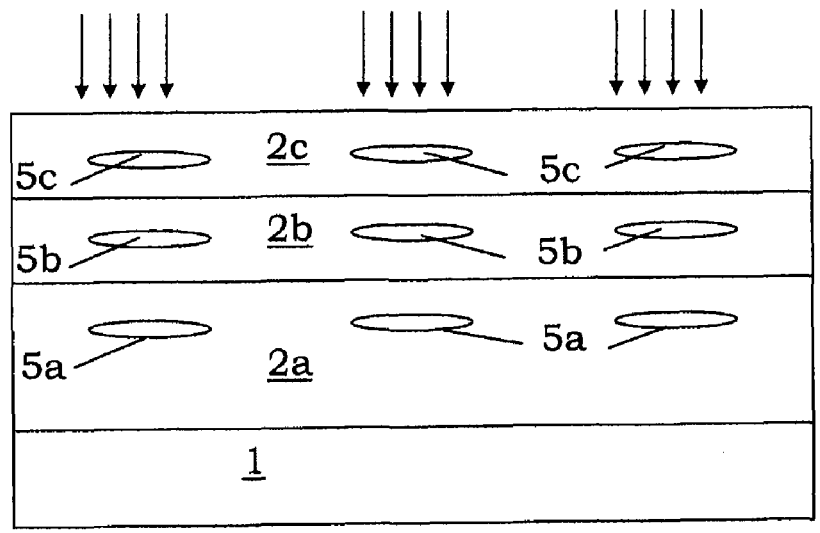
Figure 8:
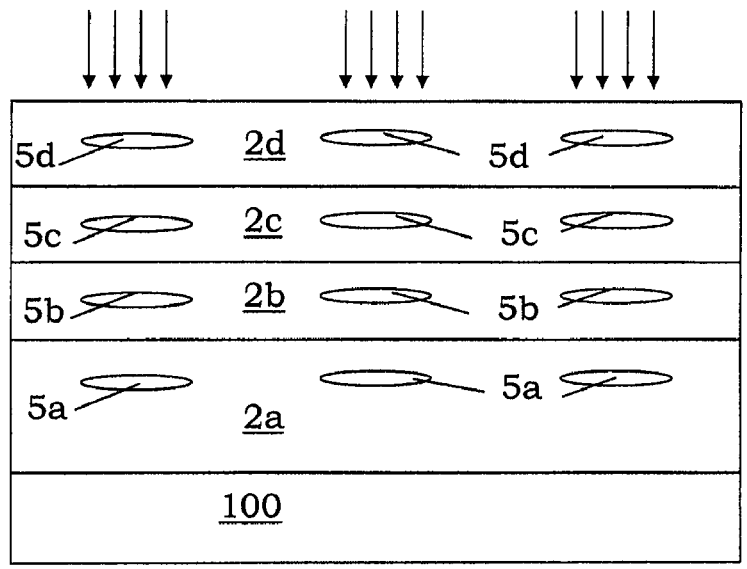
Figure 9:
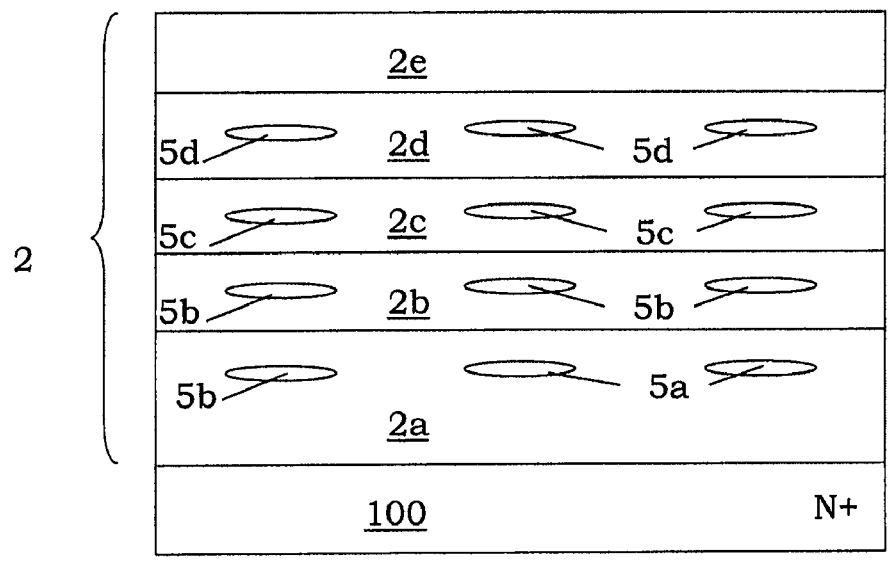
Figure 11:
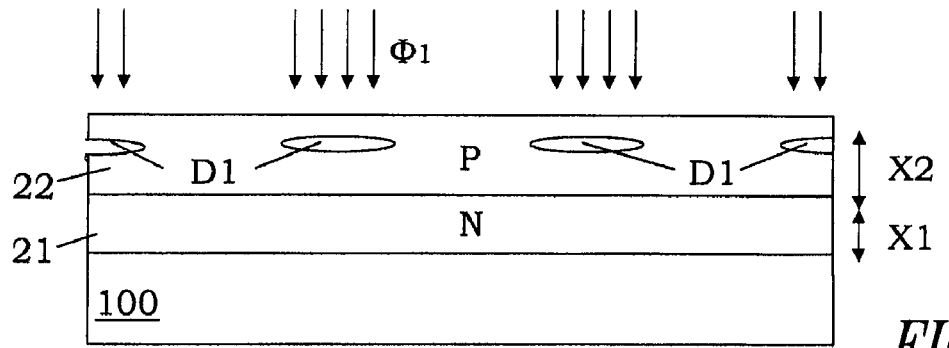

As shown in FIG. 11, on a semiconductor substrate 100, for example of the N+ type, a drain semiconductor layer 20 is formed comprising a first semiconductor layer 21, for example grown by epitaxy of the N type on the semiconductor substrate 100, having a resistivity $\rho_1$ (for example comprised between 0.5 and 5 ohm*cm) and a first thickness X1 (for example comprised between 2 and 20 μm).

On this first semiconductor layer 21 a second semiconductor layer 22 is then formed, for example grown by epitaxy of the P type, with a resistivity $\rho_2$ (for example comprised between 0.5 and 2 ohm*cm) and a thickness X2 (for example comprised between 2 and 10 μm).

Advantageously, after having formed a first photolithographic mask on the second semiconductor layer 22, a trench is formed in this second semiconductor layer 22 through the first photolithographic mask for forming a zero level indicator not shown in the figures.

Once the first mask is removed, a second mask is formed wherein a plurality of openings are formed. Through these openings a first N dopant implant step is carried out to form, by means of a subsequent diffusion step, first implanted regions D1.

Advantageously, the first selective dopant implant step is carried out with a first implant dose $\Phi_1$ chosen so that the implanted N dopant concentration balances the P dopant concentration of the second semiconductor layer 22, and the used implant energy is, for example, comprised between 200 and 800 keV, while the first dose $\Phi_1$ is, for example comprised between $5\times10^{11}$ and $5\times10^{13}$ at/cm$^2$.

As it has been already highlighted with reference to the prior art, when inside the drain semiconductor layer 20 a balance condition occurs, the highest breakdown voltage BV is obtained.

Figure 12:
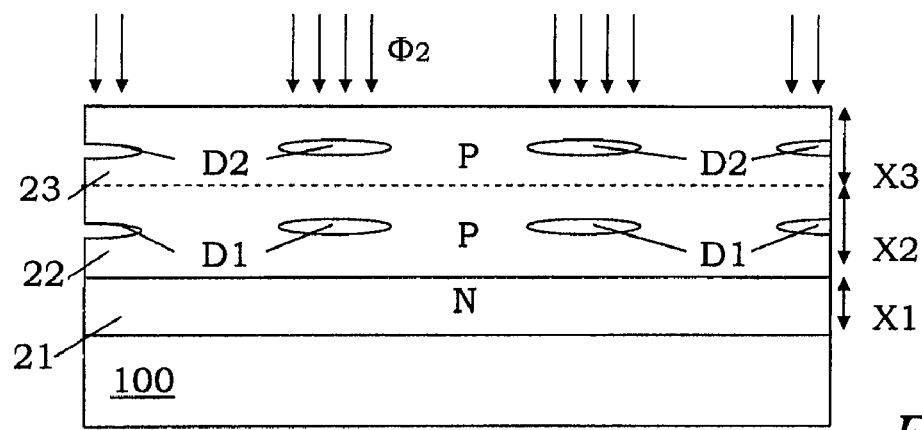

Once the second mask is removed, as shown in FIG. 12, on the second semiconductor layer 22 a third semiconductor layer 23 is formed, for example grown by epitaxy of the P type, with a resistivity $\rho_3$ (for example comprised between 0.5 and 2 ohm*cm) and a thickness X3 (for example comprised between 2 and 10 μm).

A third mask is then formed on the third semiconductor layer 23 wherein a plurality of openings are opened. Advantageously, such third mask is aligned with the second mask by means of the zero level indicator. Through these openings a second N dopant implant step is then carried out in the third semiconductor layer 23 for forming second implanted regions D2 aligned with the first implanted regions D1.

Advantageously, the second selective dopant implant step is carried out with a second implant dose $\Phi_2$ chosen so that the implanted N dopant concentration balances the P dopant concentration of the third semiconductor layer 23, and an implant energy is used for example comprised between 200 and 800 keV.

In a preferred embodiment, the third semiconductor layer 23 is chosen with a resistivity equal to a resistivity of the second semiconductor layer 22, the second implant dose $\Phi_1$ being thus equal to the first implant dose $\Phi_1$.

Figure 13:
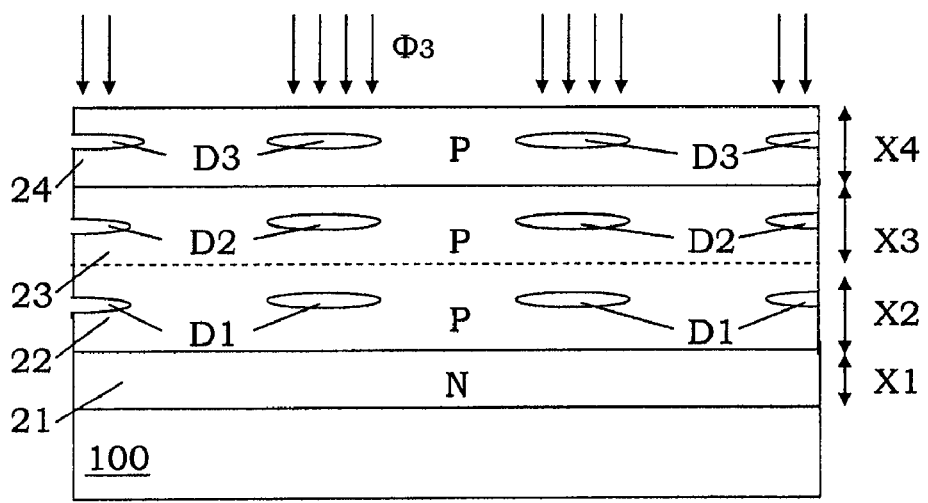

Once the third mask is removed, as shown in FIG. 13, on the third semiconductor layer 23 a fourth semiconductor layer 24 is formed, for example grown by epitaxy of the P type, with a resistivity $\rho_4$ (for example comprised between 0.5 and 2 ohm*cm) and a thickness X4 (for example comprised between 2 and 10 μm).

A fourth mask is then formed on the fourth semiconductor layer 24 wherein a plurality of openings are formed. Advantageously, such fourth mask is aligned with the previous ones by means of the zero level indicator. Through these openings a third N dopant implant step is then carried out in the fourth semiconductor layer 24 for forming third implanted regions D3 aligned with the second implanted regions D2.

The third selective dopant implant step is carried out with a third implant dose $\Phi_3$ chosen so that the implanted N dopant concentration balances the P dopant concentration of the fourth semiconductor layer 24, and an implant energy is used for example comprised between 200 and 800 keV.

In a preferred embodiment, the fourth semiconductor layer 24 is chosen with a resistivity equal to a resistivity of the third semiconductor layer 23, so that the third implant dose $\Phi_3$ is equal to the second implant dose $\Phi_2$.

Figure 14:
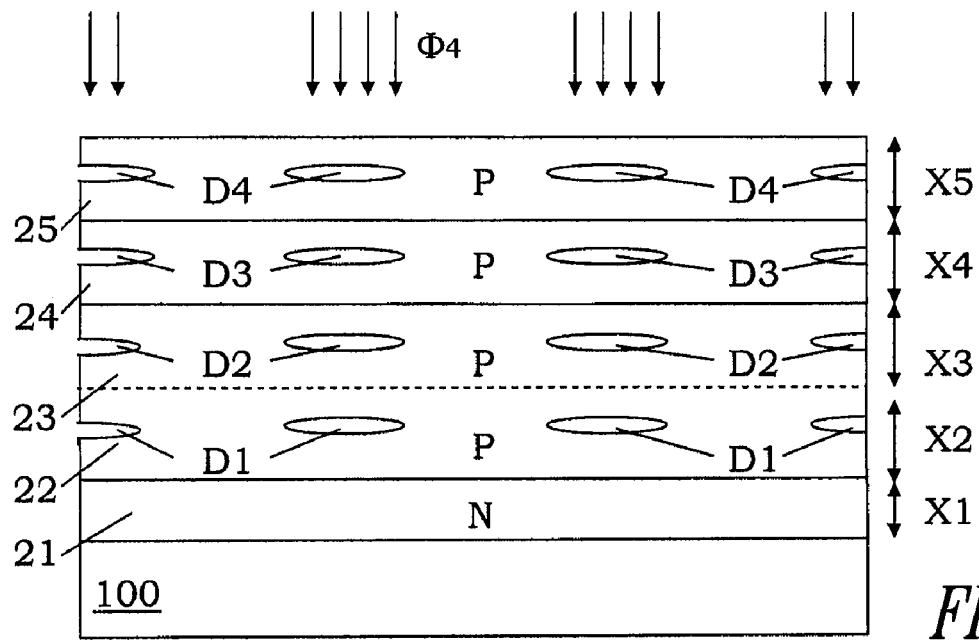

Once the fourth mask is removed, as shown in FIG. 14, on the fourth semiconductor layer 24 a fifth semiconductor layer 25 is formed, for example grown by epitaxy of the P type, with a resistivity $\rho_2$ (for example comprised between 0.5 and 2 ohm*cm) and a thickness X5 (for example comprised between 2 and 10 μm).

A fifth mask is then formed on the fifth semiconductor layer 25 wherein a plurality of openings are formed. Advantageously, such fifth mask is aligned with the previous ones by means of the zero level indicator. Through these openings a fourth N dopant implant step is then carried out in the fifth semiconductor layer 25 for forming fourth implanted regions D4 aligned with the third implanted regions D3.

The fourth selective dopant implant step is carried out with a fourth implant dose $\Phi_4$ chosen so that the implanted N dopant concentration balances the P dopant concentration of the fifth semiconductor layer 25, and an implant energy is used for example comprised between 200 and 800 keV.

In a preferred embodiment, the fifth semiconductor layer 25 is chosen with a resistivity equal to the resistivity of the fourth semiconductor layer 24, so that the fourth implant dose $\Phi_4$ is equal to the third implant dose $\Phi_3$.

Figure 15:
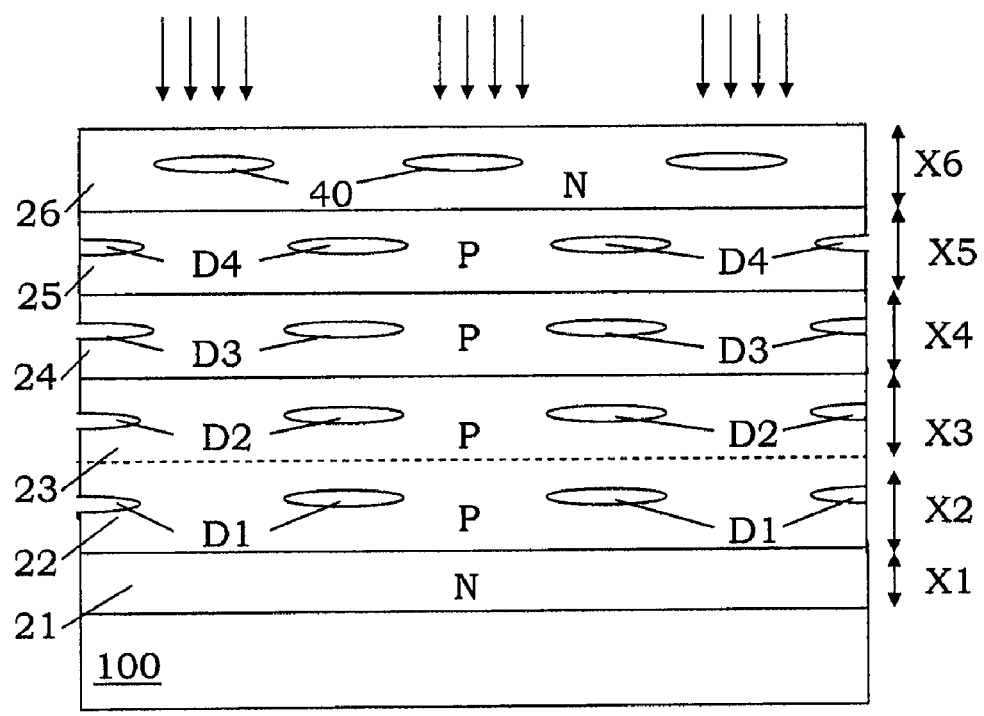

As shown in FIG. 15, once the fifth mask is removed, as last a sixth semiconductor layer 26 is then formed, for example grown by epitaxy of the N type, having a resistivity $\rho6$ (for example comprised between 0.5 and 5 ohm*cm) and a thickness X6 (for example comprised between 2 and 20 µm).

Advantageously, the resistivity $\rho6$ of the sixth semiconductor layer 26 is equal to that of the first semiconductor layer 21.

In a further embodiment being particularly advantageous, this sixth layer 26 is formed by a P semiconductor layer wherein an N implantation step is carried out, so that the P layer completely changes type.

A sixth mask is then formed on the sixth semiconductor layer 26 wherein a plurality of openings are formed.

Such openings are formed aligned with the portions of the last P semiconductor layer wherein the implanted regions D1, D2, D3 and D4 have not been formed.

Through these openings a fifth P dopant implant step is then carried out for forming body regions 40 of the device 30.

A seventh mask is then formed on the sixth semiconductor layer 26 wherein a further plurality of openings are formed aligned with the portions of this latter P semiconductor layer wherein the implanted regions D1, D2, D3 and D4 have not been formed.

Through these openings a sixth N+ dopant implant step is carried out for forming source regions 60 of the body regions 40, as shown in FIG. 16.

A diffusion thermal process is then carried out for completing the implanted regions D1, D2, D3 and D4, the body regions 40 and the source regions 60 of the device 30 and so that the implanted regions D1, D2, D3 and D4, by diffusing, form a plurality of implanted regions D being electrically continuous of the N column type which extend along the P semiconductor layers and contact the first semiconductor layer 21 and the sixth N semiconductor layer 26.

As shown in FIG. 16, it follows that the N continuous implanted column regions D delimit P column regions 50 which are aligned and in contact with the respective body regions 40.

Thus the column regions 50 are obtained by overlapping semiconductor layers while the implanted regions D delimiting them are obtained by means of diffusion of implanted regions in the semiconductor layers.

Thus, it follows that the semiconductor layer 20 forms a drain layer common by a plurality of elementary units forming the MOS power device. Each elementary unit comprises a body region 40 below which there is a column region 50, which is delimited by pairs of implanted regions D which are obtained by means of diffusion of implanted regions in the semiconductor layers.

The process for manufacturing the device 30 is then completed with conventional manufacturing steps which include the formation of a thin gate oxide layer 70 and a polysilicon layer 80 on the surface of the drain semiconductor layer 20. Openings are then provided in the polysilicon layer 80 and in the thin gate oxide layer 70 until the portions of the drain semiconductor layer 20 portions are exposed aligned with each source region 60. An insulating layer 90 is formed until it completely covers the polysilicon layer 80 and it partially covers the source regions 60, so as to allow a source metallic layer 101 formed on the device 30 to contact the source regions 60 and the body regions 40. A drain metallic layer 102 is finally formed on the lower surface of the semiconductor substrate 100.

The concentration profiles both along the N implanted regions D and along the P column regions 50 are substantially flat, as shown in FIGS. 17 and 18. In particular, in order to obtain such substantially flat concentration profiles, the diffusion thermal process, used to complete the implanted regions D, is carried out with a temperature greater than 1150° C., for four hours with a oxygen environment, i.e., high thermal budget thermal process.

In such way it is possible to obtain a charge balance and a high concentration of carriers in the N implanted regions D, thus obtaining the highest breakdown voltage BV.

Moreover, the lateral extension of the P column regions 50 which is a part not used during the conduction of the device 30, is remarkably reduced allowing the scaling (i.e., the pitch reduction, where for pitch is intended the sum of the mead widths of a P column region 50 and a N column region D) of the device itself, in presence of high thermal budget thermal processes and, subsequently, with high thicknesses of the single epitaxial layers 22, 23, 24 and 25. Therefore, the maximum width W of the P column regions 50 is less than of the maximum width $W_D$ of the N column regions D, as shown in FIG. 16.

Therefore, a power device having a pitch less or equal to 10 µm, exhibits a reduced output resistance being the height of the P column regions equal with respect to a device formed according to the prior art.

Moreover, the second semiconductor layer 22 has a thickness X2 lower than the thickness X1 of the first semiconductor layer 21. In this way the column region 50 is spaced from the semiconductor substrate 100, so that the electric field next to the interface between the semiconductor layer 20 and the semiconductor substrate 100 is reduced. A high electric field value in the interface area in fact produces an instability of the device at the breakdown voltage BV.

In the description specific reference has been made to a drain region 50 made of five epitaxial layers. However, the number of layers used can be different. Such number of semiconductor layers depend in fact on the breakdown voltage BV the final device 30 must withstand.

Moreover, in the preferred embodiment, the resistivity of the P semiconductor layers 22, 23, 24 and 25 is the same, but advantageously, the resistivity of each single semiconductor forming the drain semiconductor layer 20 is different from that of the adjacent layers so as to form stronger devices.

In conclusion, the power device 30 exhibits the following advantages:
  reduction of the number of semiconductor layers since it is possible to increase the thickness X of each single semiconductor layer,
  reduction of the output resistance being the breakdown voltage BV equal,
  possible use of high thermal budget thermal processes, and scaling of the power device thus formed.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A multi-drain power electronic device, comprising:
a drain semiconductor layer formed on a semiconductor substrate of a first type of conductivity, the drain semiconductor layer including a first semiconductor layer on said semiconductor substrate, a second semiconductor layer above the first semiconductor layer, and a semiconductor surface layer above the second semiconductor layer, the first semiconductor layer and surface layer each having the first type of conductivity and the second semiconductor layer having a second type of conductivity;
a plurality of body regions of the second type of conductivity formed in said semiconductor surface layer;
a first plurality of column regions of the first type of conductivity formed in said drain semiconductor layer; and
a second plurality of column regions of the second type of conductivity in said drain semiconductor layer, each of the column regions of the first plurality being laterally defined by consecutive column regions of the second plurality, each of the column regions of the second plurality being laterally delimited, by consecutive column regions of the first plurality, said second plurality of column regions being vertically aligned with said plurality of body regions, respectively, and each column region of said first plurality of column regions including a plurality of doped regions of the first type of conductivity positioned in contact with, and on top of, one another in the second semiconductor layer, wherein each column region of said second plurality of column regions has a maximum width less than a maximum width of each column region of said first plurality of column regions.

2. A power electronic device according to claim 1, wherein said plurality of doped regions has such dopant concentration as to balance a dopant concentration of the second semiconductor layer.

3. A power electronic device according to claim 1, wherein said first semiconductor layer and said semiconductor surface layer have a same dopant concentration value.

4. A power electronic device according to claim 1 wherein said first semiconductor layer has a thickness comprised between 2 and 20 µm.

5. A power electronic device according to claim 1, wherein said first semiconductor layer has a resistivity comprised between 0.5 and 5 ohm*cm.

6. A power electronic device according to claim 1, wherein each region of said second plurality of column regions and each region of said first plurality of column regions have a substantially flat concentration profile.

7. A power electronic device according to claim 1, wherein said column regions of the first and second plurality of column regions each have a flat concentration profile that is obtained using a thermal diffusion step that is carried out with a temperature greater than 1150° C.

8. A power electronic device according to claim 1, wherein said first plurality of column regions has a concentration that is less than a concentration of said second plurality of column regions.

9. A power electronic device according to claim 1, wherein the first semiconductor layer has a first resistivity value, the second semiconductor layer has a second resistivity value, the semiconductor surface layer has a third resistivity value, and the first and third resistivity values differ from the second resistivity value.

10. A power electronic device according to claim 1, wherein the first semiconductor layer and the surface layer are epitaxial layers of the first type of conductivity and the second semiconductor layer is an epitaxial layer of the second type of conductivity.

11. A multi-drain power electronic device, comprising:
a drain semiconductor layer formed on a semiconductor substrate of a first type of conductivity, the drain semiconductor layer including a first semiconductor layer on said semiconductor substrate, a second semiconductor layer above the first semiconductor layer, and a semiconductor surface layer above the second semiconductor layer, the first semiconductor layer being of said first type of conductivity and the second semiconductor layer having a second type of conductivity;
a plurality of body regions of the second type of conductivity formed in said semiconductor surface layer; and
a first plurality of column regions of the first type of conductivity formed in said drain semiconductor layer and delimiting a second plurality of column regions of the second type of conductivity, each region of said second plurality of column regions being aligned with one of said plurality of body regions, each column region of said first plurality of column regions including a plurality of doped regions of the first type of conductivity positioned in contact with, and on top of, one another in the second semiconductor layer, each of said second plurality of column regions having a maximum width less than a maximum width of each of said first plurality of column regions, and each of said first and second pluralities of column regions having a substantially flat concentration profile.

12. A power electronic device according to claim 11, wherein said plurality of doped regions has such dopant concentration as to balance a dopant concentration of the second semiconductor layer.

13. A power electronic device according to claim 11, wherein said first semiconductor layer and said semiconductor surface layer have a same dopant concentration value.

14. A power electronic device according to claim 11 wherein said first semiconductor layer has a thickness comprised between 2 and 20 µm.

15. A power electronic device according to claim 11, wherein said first semiconductor layer has a resistivity comprised between 0.5 and 5 ohm*cm.

16. A power electronic device according to claim 11, wherein the first plurality of column regions each have a doping concentration less then a doping concentration of each of the second plurality of column regions.

17. A power electronic device according to claim 11, wherein each of the column regions of the first plurality is laterally delimited by consecutive column regions of the second plurality and each of the column regions of the second plurality is laterally delimited by consecutive column regions of the first plurality.

18. A power electronic device according to claim 17, wherein said second plurality of column regions are vertically aligned with said plurality of body regions, respectively.

19. A power electronic device according to claim 17, wherein each column region of said second plurality of column regions has a maximum width less than a maximum width of each column region of said first plurality of column regions.

20. A power electronic device according to claim 11, wherein the first semiconductor layer and the surface layer are epitaxial layers of the first type of conductivity and the second semiconductor layer is an epitaxial layer of the second type of conductivity.

* * * * *